United States Patent
Mailoa et al.

(10) Patent No.: US 10,535,791 B2
(45) Date of Patent: Jan. 14, 2020

(54) 2-TERMINAL METAL HALIDE SEMICONDUCTOR/C-SILICON MULTIJUNCTION SOLAR CELL WITH TUNNEL JUNCTION

(71) Applicants: The Board of Trustees of the Leland Stanford Junior University, Palo Alto, CA (US); Massachusetts Institute of Technology, Cambridge, MA (US)

(72) Inventors: Jonathan P. Mailoa, Cambridge, MA (US); Colin David Bailie, Menlo Park, CA (US); Eric Carl Johlin, Iowa City, IA (US); Michael David McGehee, Menlo Park, CA (US); Tonio Buonassisi, Cambridge, MA (US)

(73) Assignees: The Board of Trustees of the Leland Stanford Junior University, Stanford, CA (US); Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/958,587

(22) Filed: Dec. 3, 2015

(65) Prior Publication Data

US 2016/0163904 A1 Jun. 9, 2016

Related U.S. Application Data

(60) Provisional application No. 62/086,785, filed on Dec. 3, 2014.

(51) Int. Cl.
*H01L 31/078* (2012.01)
*H01L 31/02* (2006.01)
(Continued)

(52) U.S. Cl.
CPC ...... *H01L 31/078* (2013.01); *H01L 31/02008* (2013.01); *H01L 31/022425* (2013.01);
(Continued)

(58) Field of Classification Search
CPC ............ H01L 31/0687; H01L 31/0725; H01L 31/076; H01L 31/078
See application file for complete search history.

(56) References Cited

U.S. PATENT DOCUMENTS 7,148,417 B1 * 12/2006 Landis ............... H01L 31/0725
136/261
9,391,287 B1 7/2016 Huang et al.
(Continued)

FOREIGN PATENT DOCUMENTS

WO 2014/045021 A1 3/2014
WO WO 2015017885 A1 * 2/2015 ......... H01L 51/4213
(Continued)

OTHER PUBLICATIONS

Liu, et al. (2013). Efficient planar heterojunction perovskite solar cells by vapour deposition. Nature, 501(7467), 395-398.*
(Continued)

*Primary Examiner* — William E McClain
(74) *Attorney, Agent, or Firm* — Kaplan Breyer Schwarz, LLP (57) ABSTRACT

A 2-terminal multi-junction solar cell having a thin film of metal halide semiconductor as the top solar-cell material and crystalline silicon as the bottom solar-cell material. In the illustrative embodiment, the top solar-cell material is a perovskite of the form $AM(I_xH_{1-x})_3$, where A is a cation, preferably methylammonium ($CH_3NH_3$), formamidinium ($[R_2N-CH=NR_2]^+$), or cesium; M is metal, preferably Pb, Sn, Ge; H is a halide, preferably Br or Cl; and x=iodine fraction, in the range of 0 to 1, inclusive. The integration of the two solar-cell materials is enabled by the use of a tunnel junction composed of indirect band-gap material.

18 Claims, 5 Drawing Sheets

(51) Int. Cl.
*H01L 31/0224* (2006.01)
*H01L 31/0336* (2006.01)
*H01L 31/0725* (2012.01)
*H01L 31/18* (2006.01)
*H01L 51/42* (2006.01)

(52) U.S. Cl.
CPC ...... *H01L 31/0336* (2013.01); *H01L 31/0725* (2013.01); *H01L 31/18* (2013.01); *H01L 51/4213* (2013.01)

(56) References Cited

U.S. PATENT DOCUMENTS

| | | | |
|---|---|---|---|
| 9,564,593 | B2 | 2/2017 | Karunadasa et al. |
| 2002/0081786 | A1* | 6/2002 | Toet ............... B82Y 10/00 438/166 |
| 2002/0117199 | A1 | 8/2002 | Oswald |
| 2010/0051098 | A1* | 3/2010 | Sheng ............... C23C 16/24 136/256 |
| 2011/0132423 | A1* | 6/2011 | Joge ............... H01L 31/0236 136/244 |
| 2011/0139227 | A1* | 6/2011 | Sivananthan ......... H01L 29/267 136/255 |
| 2011/0146755 | A1 | 6/2011 | Curran et al. |
| 2011/0162697 | A1* | 7/2011 | Sivananthan ......... H01L 31/078 136/255 |
| 2011/0232758 | A1* | 9/2011 | Khanarian ........ H01L 31/02167 136/260 |
| 2011/0272012 | A1* | 11/2011 | Heng ............... H01L 31/0745 136/255 |
| 2012/0017976 | A1 | 1/2012 | Nechache et al. |
| 2014/0290727 | A1* | 10/2014 | Yamamoto ............ H01L 31/078 136/255 |
| 2015/0053259 | A1* | 2/2015 | Hardin ............... C23C 14/0623 136/255 |
| 2015/0249170 | A1* | 9/2015 | Snaith ............... H01L 51/422 136/256 |
| 2015/0303343 | A1* | 10/2015 | Kleimam ............... H01L 31/065 136/244 |
| 2016/0035927 | A1* | 2/2016 | Gershon ............... H01L 31/0326 136/244 |
| 2016/0087233 | A1* | 3/2016 | Guha ............... H01L 31/0322 136/244 |
| 2016/0133672 | A1* | 5/2016 | Koposov ............... H01L 27/302 136/255 |
| 2016/0163904 | A1 | 6/2016 | Mailoa et al. |
| 2016/0190377 | A1* | 6/2016 | Green ............... H01L 51/4213 136/244 |
| 2016/0307704 | A1* | 10/2016 | Hillhouse ....... H01L 31/022441 |
| 2016/0351808 | A1 | 12/2016 | Luchinger et al. |
| 2017/0194101 | A1 | 7/2017 | Karunadasa et al. |
| 2017/0358398 | A1* | 12/2017 | Beaumont ............ H01G 9/2009 |
| 2018/0277696 | A1 | 9/2018 | Karunadasa et al. |
| 2018/0290897 | A1 | 10/2018 | Snaith et al. |
| 2018/0309077 | A1 | 10/2018 | Bush et al. |

FOREIGN PATENT DOCUMENTS

| | | |
|---|---|---|
| WO | 2015/085441 A1 | 6/2015 |
| WO | 2017/037448 A1 | 3/2017 |

OTHER PUBLICATIONS

Löper, et al. (2014). Organic-inorganic halide perovskites: Perspectives for silicon-based tandem solar cells. IEEE Journal of Photovoltaics, 4(6), 1545-1551.*

Todorov, et al. (2014). Perovskite-kesterite monolithic tandem solar cells with high open-circuit voltage. Applied Physics Letters, 105(17), 173902.*

Yi Wei: "Synthesis and optical properties of self-assembled 2D layered orgnic-inorganic perovskites for optoelectronics". Thesis. ENS Cachan, Jul. 2012.

Tanaka et al: "Bandgap and exciton binding energies in lead-iodide-based natural quantum-well crystals". 2003. Science and technology or advanced materials, 4:6, 599-604.

Lee et al.: "Efficient hybrid solar cells based on meso-superstructured organometal halide perovskites". Science 338, 643-647 (2012).

Examiner: Bernier, Lindsey: "Non-Final Office Action", issue in related U.S. Appl. No. 14/733,462, dated Mar. 10, 2016, 14 pages.

Examiner: Bernier, Lindsey: "Final Office Action", issued in related U.S. Appl. No. 14/733,462, dated Oct. 28, 2016, 28 pages.

Examiner: Bernier, Lindsey: "Notice of Allowance" issued in related U.S. Appl. No. 14/733,462, dated Nov. 21, 2016, 10 pages.

Colin D. Bailie et al., "High-efficiency tandem perovskite solar cells", https://web.stanford.edu/group/mcgehee/publications/MRS2015.pdf, "MRS Bulletin", dated Aug. 1, 2015, vol. 40.

Authorized Officer: Lee W. Young, "International Search Report and Written Opinion" issued in related PCT Application No. PCT/US2016/058156, dated Apr. 19, 2017.

Authorized Officer: Lee W. Young, "International Search Report and Written Opinion" issued in related PCT App. No. PCT/US2015/063817 dated Mar. 22, 2016.

Stoumpos, Constantinos C., et al.; Semiconductng Tin and Lead Iodide Perovskites with Organic Cations: Phase Transitions, High Mobilities, and Near-Infrared Photoluminescent Properties; Inorg. Chem. 2013, 52, 9019-9038 (Year: 2013).

Slavney, Adam H. et al.; A Bismuth-Halide Double Perovskite with Long Carrier Recombination Lifetime for Photovoltaic Applications; D. Am. Ohm. Soc., 2016, 138, 2138-2141 (Year: 2016).

Requirement for Restriction/Election received for French Application No. 15/769,287, dated Dec. 6, 2018, 11 pages.

Non-Final Rejection received for U.S. Appl. No. 15/769,287, dated Apr. 4, 2019, 11 pages.

Non-Final Rejection received for U.S. Appl. No. 15/397,565, dated Mar. 8, 2019, 15 pages.

GB Application No. 1515546.8, priority document for WO 2017/037448 A1; filed Sep. 2, 2015 (Year: 2015).

* cited by examiner

2-TERMINAL METAL HALIDE SEMICONDUCTOR/C-SILICON MULTIJUNCTION SOLAR CELL WITH TUNNEL JUNCTION

STATEMENT REGARDING FEDERALLY SPONSORED RESEARCH

This case claims priority to U.S. patent application 62/086,785 filed Dec. 3, 2014 and which is incorporated herein by reference.

STATEMEMT REGARDING FEDERALLY SPONSORED RESEARCH

This invention was made with Government support under Grant Nos. DE-EE0004946 and DE-EE0006707 awarded by the U.S. Department of Energy. The Government has certain rights in the invention.

FIELD OF THE INVENTION

The present invention relates generally to solar cells.

BACKGROUND OF THE INVENTION

Solar-to-electricity conversion efficiency is the key technical driver influencing photovoltaic (PV) module costs. The record efficiency of crystalline silicon (c-Si) single-junction PV devices increased from 25% to 25.6% during the last fifteen years, asymptotically approaching the Shockley-Queisser (S-Q) efficiency limit of 29.4%. To exceed this efficiency limit, multi-junction solar cells have been proposed.

Multi-junction (MJ) solar cells have multiple p-n junctions made of different semiconductor materials. The p-n junction of each different semiconductor material produces electric current in response to different wavelengths of light. The use of multiple semiconducting materials allows the absorbance of a broader range of wavelengths, improving the cell's solar-to-electricity conversion efficiency.

Currently, high-efficiency commercial "tandem" solar cells (two p-n junctions or "absorbers") are exceedingly expensive, as they are made by growing films of III-V semiconductors epitaxially on single-crystal wafers. Tandem solar cells have also been made with CIGS, amorphous silicon and organic semiconductors using low-cost processing methods, but these have achieved only modest record cell efficiencies of 23.2, 13.4, and 12.0 percent, respectively.

It was previously noted that PV module efficiency is main driver for reducing PV module prices. Yet, the efficiency of a solar cell is fundamentally limited by its energy band gap ($E_g$). Silicon, the most widely used material for solar cells, has an $E_g$ of 1.12 eV, which limits its Shockley-Queisser efficiency to about 29 percent. Because advanced solar-cell technology already approaches the practical theoretical efficiency limit, the maximum price savings available by further efficiency improvements is finite. To continue extracting cost-reduction benefit from efficiency, concepts beyond the S-Q efficiency limit are needed.

SUMMARY OF THE INVENTION

The present invention provides a 2-terminal, MJ solar cell that avoids some of the disadvantages of the prior art. In some embodiments, the 2-terminal MJ solar cell is a tandem (two p-n junctions) solar cell having a thin film of metal halide semiconductor as the top solar-cell material and c-Si as the bottom solar-cell material. In the illustrative embodiment, the metal halide semiconductor is a metal halide perovskite. The integration of the two solar-cell materials is enabled by the use of a tunnel junction composed of indirect band-gap material.

To advance PV module efficiency beyond the S-Q efficiency limit, the inventors considered approaches that satisfied several criteria:

The increasing importance of capital (fixed) costs on PV module price suggested to the inventors that any potential efficiency gains must be carefully balanced against increases in equipment requirements and potential yield. Thus, a "best" approach would be likely to leverage existing manufacturing infrastructure.

The approach should be able to utilize commercially available production equipment for rapid scaling.

With the foregoing criteria in mind, the inventors recognized that a Si-based solar cell having an MJ configuration could leverage the large amount of existing c-Si manufacturing capacity. The inventors realized that a promising approach to surpassing the efficiency limit would be to reduce the thermalization loss of high energy photons by forming solar cells in an MJ configuration using materials with different band gaps $E_g$. Two-junction Si-based tandems have the highest efficiency entitlement (a maximum of about 39 percent) when the band gap of the top sub-cell is between 1.6 and 1.9 eV. However, very few materials exhibit high open-circuit voltages ($V_{oc}$) within this band gap range. As previously mentioned, the $E_g$ of Si is only 1.12 eV. Thus, although Si could be used for the bottom cell, a different material should be selected for use in the top cell of the multi-junction solar cell.

The inventors recognized that pairing a metal halide semiconductor with c-Si to form an MJ solar cell could be a potentially fruitful approach because of the ability of the former class of materials to be an efficient solar cell material while, at the same time, being deposited at low temperature and requiring low capital expenditure. Metal halide semiconductor materials also tend to be earth-abundant, making them suitable for rapid scaling and deployment. Also, unlike III-V materials, metal halide semiconductors would not need to be lattice matched to the Si substrate.

In accordance with the illustrative embodiment, the metal halide semiconductor used in one of the sub-cells of the inventive solar cell is a perovskite of the form:

$$AM(I_xH_{1-x})_3 \quad [1]$$

where: A is a cation, preferably methylammonium ($CH_3NH_3$), formamidinium ($[R_2N{-}CH{=}NR_2]^+$), or cesium;
M is a metal;
H is a halide, preferably Br or Cl; and
x=iodine fraction, in the range of 0 to 1, inclusive.

M is preferably Pb, Sn, Ge, Cs, Bi, but most metals may suitably be used including, without limitation, Ca, Sr, Cd, Mn, Fe, Co, Yb, etc. It is notable that alloy mixtures of metal halide semiconductors can be used, as well.

More generally, the metal halide semiconductor can be represented as:

$$AMX_2 \quad [2]$$

where: A is an elemental or molecular cation or combination of cations, including those mentioned above;
M is a metal, including those mentioned above;
X is a halide or combination of halides; and z is a number between 1 and 4 describing the relative number of halides with respect to the metal.

Figure 1:
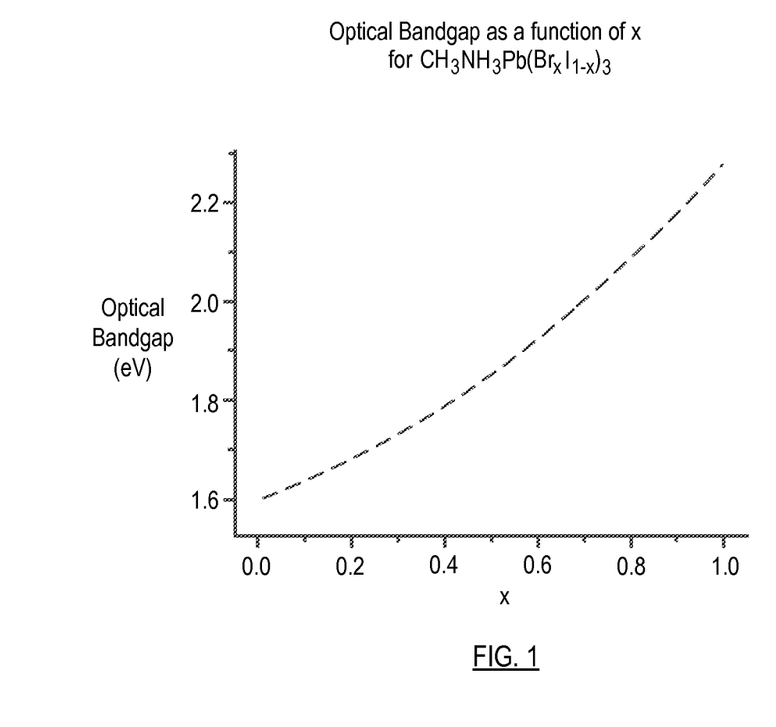
FIG. 1 depicts plot 100 showing the bandgap of mixed halide perovskite as a function of bromine fraction, x.

When tandems solar cells are made with c-Si as the bottom cell, the ideal bandgap for the top solar cell is about 1.7 to 1.8 eV. Perovskite bandgap can be continuously tuned from 1.6 eV to 2.3 eV by substituting iodide with bromide, as shown in FIG. 1. In some alternative embodiments, metal halide compounds with non-perovskite crystal structure may suitably be used. For example, simple metal halides such as $BiI_3$ have a band gap of about 1.7 to 1.8 eV. It is crucial that the large bandgap junction of a tandem solar cell yield a large open-circuit voltage ($V_{oc}$). The $V_{oc}$ of record devices with $CH_3NH_3PbI_3$ (methyl ammonium lead iodide perovskite, i.e., A is methylammonium and x=1 in expression [1]) is 1.18 V, despite having a bandgap $E_g$ of only 1.6 eV.

The large open-circuit voltage arises from the unique electrical properties of metal halide perovskites, which makes them highly tolerant of defects. This high defect tolerance has the potential to enable electronic properties for solar cells with high throughput and low-cost solution or physical vapor-deposition processing and without the requirement of expensive single-crystal substrates.

As such, using a metal halide semiconductor, such as and without limitation methyl ammonium lead halide perovskite, in an MJ solar cell with c-Si appeared to the inventors to be a promising candidate. However, no method to electrically couple the perovskite to the Si sub-cell and simultaneously transmit longer-wavelength light through the perovskite top-cell to the Si bottom cell in a 2-terminal multi-junction configuration is known.

Generally, tunnel junctions are intended for the foregoing purpose; that is, to provide low electrical resistance and low optical losses between sub-cells in a multi-cell (multi-junction) solar cell. In the absence of tunnel junction, the p-doped region of the top sub-cell would be directly connected with the n-doped region of the adjacent sub-cell. A p-n junction with opposite direction to the other p-n junctions would appear between the two adjacent cells. This would result in photo-voltage that is lower than if there were no parasitic diode. The tunnel junction is used to decrease this effect. As typically implemented, a tunnel junction is simply a wide band gap, highly doped diode. In order to avoid a reduction in the performance (efficiency) of multi-junction solar cells, the tunnel junction must be transparent to wavelengths absorbed by the next cell in the multi-junction solar cell.

Inter-band tunneling (i.e., a tunnel junction) is used in III-V tandem solar cells. The tunnel junction of these solar cells is typically formed from direct-bandgap semiconductors in which parasitic absorption of light is a design constraint. Such a tunnel junction would therefore be unsuitable for use in conjunction with embodiments of the invention. Alternatively, direct-bandgap metal-like semiconductors are used as tunnel junction alternatives (e.g., transparent conducting oxides such as fluorine-doped tin oxide or tin-doped indium oxide, etc.). These materials, although very transparent in the visible spectrum, have reduced transparency at longer wavelengths due to free carrier absorption. As a consequence, such tunnel junction alternatives are not suitable for use in conjunction with embodiments of the present invention.

In accordance with embodiments of the invention, multi-junction solar cells incorporate a tunnel junction that is formed from an indirect bandgap semi-conductor. The indirect bandgap results in a relatively reduced (compared to a direct-bandgap material) tendency to absorb light. In accordance with the illustrative, embodiment, the indirect bandgap semiconductor is silicon and the resulting tunnel junction is quite transparent to relatively longer wavelength (i.e., longer than the wavelength-range of visible portion of the EM spectrum) light.

In accordance with the illustrative embodiment, a 2-terminal metal halide perovskite/c-Si MJ solar cell is formed via monolithic integration, wherein a thin film of the sub-cell including the aforementioned perovskite is grown on top of a wafer-based crystalline silicon sub-cell. A tunnel junction facilitates electron tunneling from the electron selective contact of the top perovskite cell into the p-type emitter of the bottom silicon cell, instead of a recombination layer being used in other perovskite tandem systems. As previously mentioned, in accordance with the illustrative embodiment, the tunnel junction is made out of an indirect band gap material, such as silicon, thereby enabling electrical coupling with minimal parasitic absorption within the tunnel junction.

Furthermore, due to the conduction band alignment between the tunnel junction and the perovskite cell's electron selective contact ($TiO_2$), no transparent conducting oxide (TCO) such as fluorine-doped tin oxide (FTO) or tin-doped indium oxide (ITO) is required, further reducing parasitic optical absorption in the perovskite/silicon multi-junction cell. In fact, this approach to the tunnel junction resulted in an open circuit voltage of about 1.6 V, which is a high value for a $CH_3NH_3PbI_3$ perovskite/Si multi-junction solar cell.

In some embodiments, the invention provides an article comprising a two-terminal MJ solar cell, wherein the solar cell comprises a bottom sub-cell comprising a silicon base; a tunnel junction disposed above the silicon base, wherein the tunnel junction comprises a material characterized by an indirect band gap; and a top sub-cell disposed above the tunnel junction, wherein the top sub-cell comprises a metal halide perovskite.

In some embodiments, the invention provides an article comprising a two-terminal multi-junction solar cell, wherein the solar comprises a c-Si sub-cell; a bottom electrode disposed proximal to a bottom surface of the c-Si sub-cell; a tunnel junction disposed on the c-Si sub-cell, wherein the tunnel junction comprises a material having an indirect band gap; a metal halide semiconductor sub-cell disposed on the tunnel junction; and a top electrode disposed on proximal to a top surface of the metal halide semiconductor sub-cell.

In some embodiments, the c-Si sub-cell comprises a silicon base, a back surface field disposed proximal to a bottom surface of the silicon base, and an emitter disposed proximal to a top surface of the silicon base. In some embodiments, the metal halide semiconductor sub-cell comprises a transport layer, wherein the transport layer is an electron transport layer when a silicon base in the crystalline silicon sub-cell is n-type silicon and wherein the transport layer is a hole transport layer when the silicon base in the crystalline silicon sub-cell is p-type silicon; a layer of metal halide semiconductor; and a heterojunction contact, wherein the heterojunction contact is p-type when the silicon base is n-type silicon and the heterojunction contact is n-type when the silicon base is p-type silicon.

In some embodiments, the invention provides a method for forming a two-terminal MJ solar cell, wherein the method comprises forming a c-Si sub-cell; forming a tunnel junction on the c-Si sub-cell from indirect bandgap material; and forming a metal halide semiconductor sub-cell.

In some embodiments, the metal halide semiconductor is a metal halide perovskite. In some embodiments, the metal halide perovskite is methylammonium lead iodide perovskite.

DETAILED DESCRIPTION

Definitions. A definition for each of the terms listed below is provided for use in understanding the description and interpreting the appended claims.

"About" when referencing a measurement (e.g., diameter, length, thickness, etc.) means within 15% of the stated value.

"Crystalline silicon" means monocrystalline, multi-crystalline, or polycrystalline.

"Tandem" solar cell means a solar cell having two different absorbers (e.g., silicon and a metal halide semiconductor).

"Multi-junction" solar cell means a solar cell having two or more absorbers (p-n junctions) in the same solar cell.

"Nanowire" means electrically conductive material that is less than 1000 nanometers in diameter and greater than 1000 nanometers in length.

"2-terminal" solar cell refers to a tandem solar cell in which the two sub-cells (e.g., the perovskite sub-cell and the silicon sub-cell) are electrically connected in series with each other. This is distinguished, for example, from a 4-terminal tandem cell wherein the two sub-cells are not electrically connected to each other and instead are operated independently.

Solar Cell.

Figure 2A:
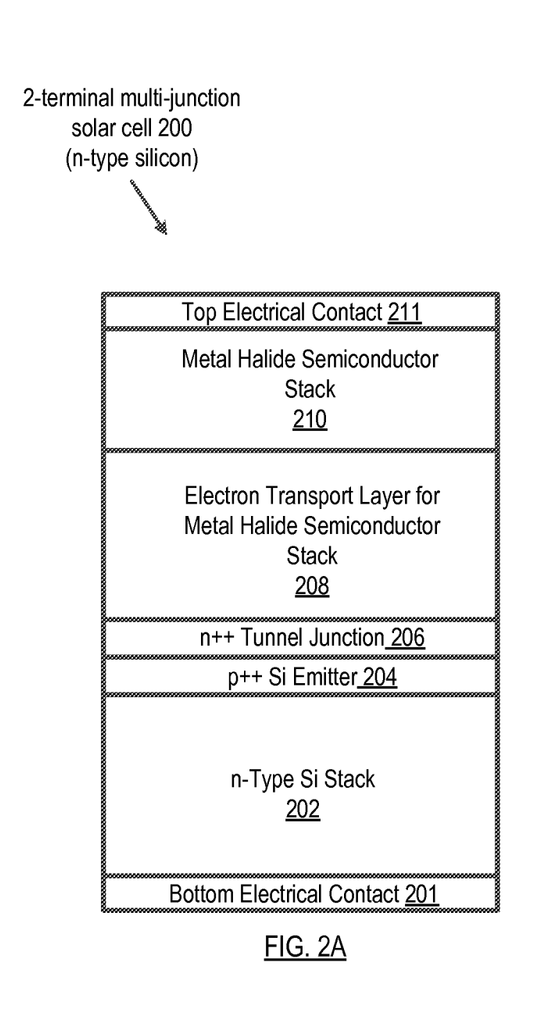
FIG. 2A depicts 2-terminal metal halide semiconductor/c-Si multi-junction solar cell based on n-type silicon, in accordance with an illustrative embodiment of the present invention.

FIG. 2A depicts a schematic representation of 2-terminal, metal halide semiconductor/c-Si multi-junction solar cell 200 with an n-type silicon base. The solar cell includes: bottom electrical contact 201, n-type Si stack 202, $p^{++}$ Si emitter 204, $n^{++}$ Si tunnel junction 206, electron-transport layer 208 for the metal halide semiconductor stack, metal halide semiconductor stack 210, and top electrical contact 211.

Figure 2B:
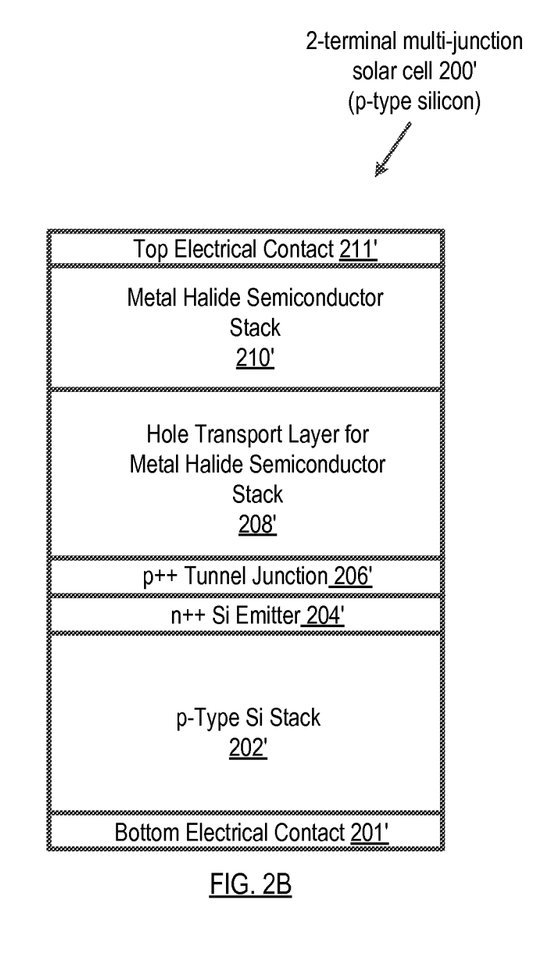
FIG. 2B depicts 2-terminal metal halide semiconductor/c-Si multi-junction solar cell based on p-type silicon, in accordance with an illustrative embodiment of the present invention.

FIG. 2B depicts a schematic representation of 2-terminal, metal halide semiconductor/c-Si multi-junction solar cell 200' with an p-type silicon base. The solar cell includes: bottom electrical contact 201', p-type Si stack 202', $n^{++}$ Si emitter 204', $p^{++}$ Si tunnel junction 206', hole-transport layer 208' for the metal halide semiconductor stack, metal halide semiconductor stack 210', and top electrical contact 211'.

Solar cells 200 and 200' are top illuminated; that is, their architecture is such that they are intended to be illuminated from the "top," as oriented in FIGS. 2A and 2B. That is, light is received at the top electrical contact 211 or 211'. It will be appreciated, however, that depending upon packaging or other constraints, the top electrical contact might not be oriented "above" other layers when in use. As used in this description and the appended claims, the descriptors "above," "top," "below," "bottom," etc. are referenced relative to the light receiving surface, which is top electrical contact 211. In other words, regardless of the orientation of solar cell 200, the top electrical contact is always considered to be "above" the other elements of the solar cell shown in FIG. 2A. Therefore, when a first layer is described as being "above" or "on top of" a second layer, it means the first layer is relatively closer to the top electrical contact than the second layer is to the top electrical contact. Conversely, when a first layer is described as being "below," etc., a second layer, it means the first layer is relatively further from the top electrical contact than is the second layer.

Furthermore, the terms "above," "on top of," "below," etc., when describing two layers, do not necessarily mean that the layers are "directly adjacent to" or "in contact with" one another.

It will be appreciated that the structure of the two solar cells are similar to one another, but any material that is p-type in solar cell 200 of FIG. 2A will be n-type in solar cell 200' of FIG. 2B. Similarly, any material that is n-type in solar cell 200 will be p-type in solar cell 200'. And, of course, electron transport layer 208 of solar cell 200 is replaced by hole transport layer 208' in solar cell 200'. For brevity, this disclosure will only discuss solar cell 200 based on n-type silicon; those skilled in the art will understand how to make and use solar cell 200' based on p-type silicon in light of the disclosure concerning solar cell 200.

Figure 3:
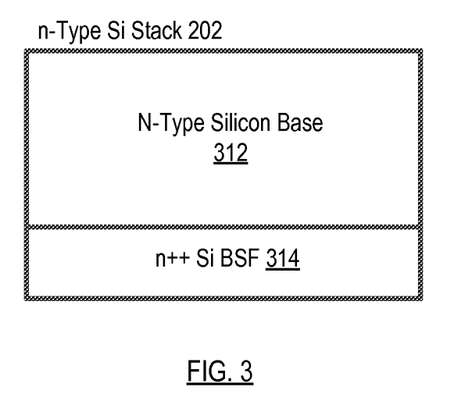
FIG. 3 depicts further detail of a silicon sub-cell stack in the solar cell of FIG. 2A.

FIG. 3 depicts further detail of an embodiment of n-type silicon stack 202, including n-type silicon 312 and n-type silicon back surface field (BSF) 314. The silicon portion ("the silicon sub-cell") of solar cell 200 (or 200') includes the Si stack 202 (or 202') and $p^{++}$ Si emitter 204.

Figure 4:
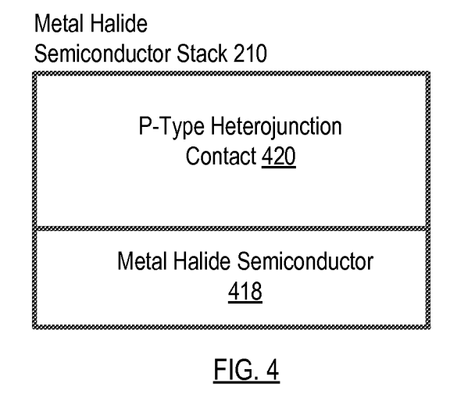
FIG. 4 depicts further detail of a metal halide semiconductor sub-cell stack in the solar cell of FIG. 2A.

FIG. 4 depicts further detail of an embodiment of metal halide semiconductor stack 210, including metal halide semiconductor 418 and organic p-type heterojunction contact 420. The metal halide semiconductor portion ("the metal halide semiconductor sub-cell") of solar cell 200 (or 200') includes metal halide semiconductor stack 210 (or 210') and electron-transport layer 208 (or hole transport layer 208').

Bottom electrical contact 201 and top electrical contact 211 are the electrical contacts by which electrical current is withdrawn from the solar cell. Both such contacts comprise, of course, electrically conductive material. In the illustrative embodiment, the solar cell is illuminated from the top. As such, electrical contact 211 must be physically adapted (either by virtue of its material composition or configuration) to enable sunlight to pass and enter the underlying layers of solar cell 200.

Solar cell 200 also includes a conventional anti-reflection coating (not depicted) over the top electrical contact to reduce surface reflection.

Method of Fabrication.

Figure 5:
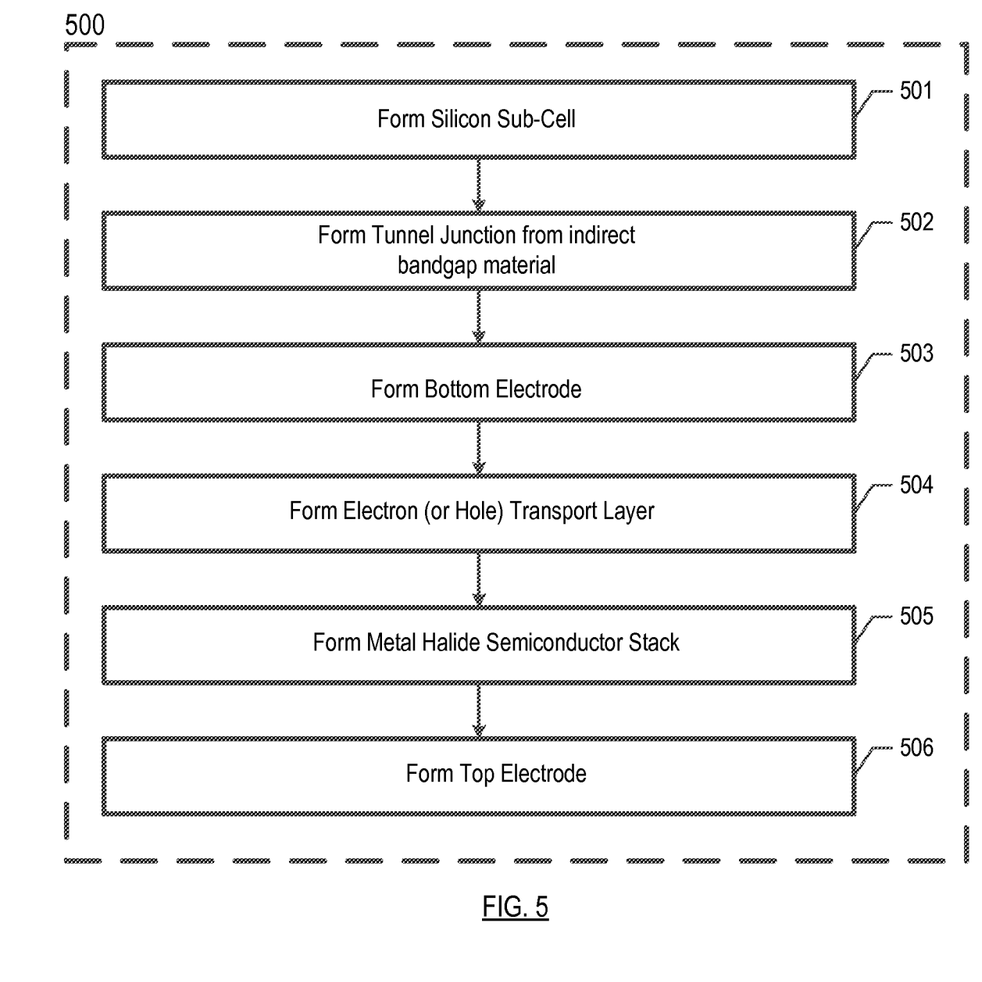
FIG. 5 depicts a method for forming the solar cell of FIG. 2A.

FIG. 5 depicts method 500 in accordance with an illustrative embodiment of the present invention. Method 500 includes:
  operation 501 (forming silicon sub-cell);
  operation 502 (forming tunnel junction);
  operation 503 (forming bottom electrical contact);
  operation 504 (forming electron transport layer);

operation 505 (forming metal halide semiconductor stack); and operation 506 (forming top electrical contact).

These operations are discussed in detail below in conjunction with FIGS. 6A through 6E.

Figures 6A, 6B, 6C, 6D, 6E:
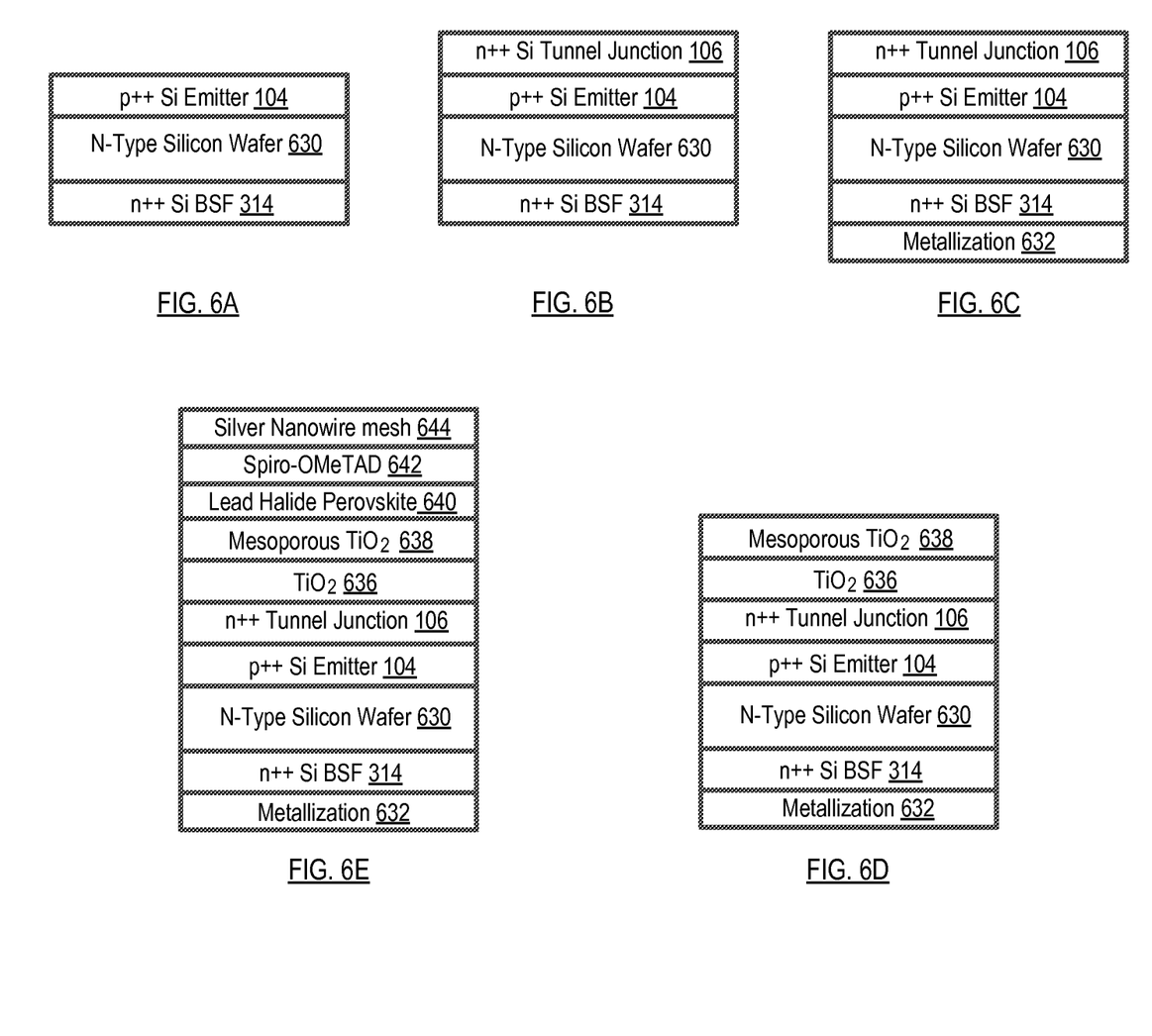
FIGS. 6A through 6E depict the sequential formation of a solar cell in accordance with the method of FIG. 5.

With continuing reference to FIG. 5 and with reference to FIGS. 2, 3, and FIG. 6A, in operation 501, the silicon sub-cell is formed. In some embodiments, this operation includes the steps of texturing the back surface of n-type silicon wafer 630 (also referred to as the "base"), implanting boron on the top surface of the Si base and implanting phosphorous on the textured back surface of the Si base. This is performed at sufficiently high doping levels such that, after annealing, $p^{++}$ silicon emitter 204 is formed at the top surface of Si wafer or base 630 and n-type silicon BSF 314 is formed at the textured back surface. The base has a thickness that is typically in the range of about 10 to about 1000 microns, emitter 204 has a thickness that is typically in the range of about 1 to about 1000 nanometers, and BSF 314 (which is optional), has a thickness that is typically in the range of about 1 to 1000 nanometers.

It is notable that the doping of base silicon 630 is not of primary importance. Rather, what is of particular importance is that there is a $p^{++}Si/n^{++}Si$ tunnel junction on top and $n^{++}$ Si on the bottom of Si base 630 for solar cell 200 of FIG. 2A or an $n^{++}Si/p^{++}Si$ tunnel junction on top and $p^{++}$ Si on the bottom of the Si base for solar cell 200' of FIG. 2B. As those skilled in the art will understand, if the Si base doping is changed from what was discussed in the illustrative embodiment, the emitter is on the bottom of the Si base instead of on top of it. This is known as a "rear-emitter."

Referring now to FIG. 5 and FIGS. 2, 4, and 6B in operation 502, Si-based tunnel junction 106 is formed on top of $p^{++}$ silicon emitter 204. The tunnel junction facilitates carrier recombination (i.e., holes from the n-type silicon base passing through the p-type emitter and electrons from organic-inorganic semiconductor 418 passing through electron transport layer 108). Tunnel junction 106 is formed by creating a highly-doped silicon layer (doping concentration greater than $10^{19}$ atoms of dopant/cm$^3$) directly on $p^{++}$ silicon emitter 204. In this embodiment, using an n-type silicon wafer, the tunnel junction is $n^{++}$ doped. If the silicon wafer were p-type, the tunnel junction would, of course, be $p^{++}$ doped.

In the illustrative embodiment, tunnel junction 106 is formed by depositing degenerately doped $n^{++}$ amorphous silicon using plasma-enhanced chemical vapor deposition (PECVD).

In addition to facilitating carrier recombination, in accordance with the present teachings, tunnel junction 206 is physically adapted to transmit wavelengths of EM radiation longer than those in the visible range. Although silicon is used to form the tunnel junction in the illustrative embodiment, other materials having an indirect band-gap may suitably be used for forming a tunnel junction in other embodiments.

Referring now to FIGS. 5, 3 and 6C, in operation 503, the bottom electrode is formed. In the illustrative embodiment, the bottom electrode is formed via a standard back metallization process. In some embodiments, this metallization comprises multiple layers, each layer formed from a different metal, and each layer being in the range from tens to hundreds of nanometers in thickness. Although all the metals are necessarily electrically conductive, the presence of more than one metal in the bottom electrode is occasioned by the fact that properties such as adhesion and the ability to act as a metal diffusion barrier are important, but not necessarily possessed to the required degree by the metal with the highest electrical conductivity. For example, in some embodiments, the metals chosen include: a layer of titanium having a thickness of about 20 nanometers and used for adhesion, a layer of palladium having a thickness of about 20 nanometers and used as a metal diffusion barrier, and a layer of silver having a thickness of about 300 nanometers and used for electrical conduction. Back metallization layer 632 serves as a negative electrical contact for the solar cell 200.

The silicon wafer (with the various deposited layers) is optionally diced into smaller pieces (typically of uniform size and in a range from about 1×1 cm$^2$ to about 2×2 cm$^2$) following back metallization. In some other embodiments, dicing could be done at a later stage of the process (or not at all).

Referring now to FIGS. 5, 2, and 6D in operation 504, electron transport layer 208 is formed. This serves as the n-type heterojunction contact for the organic-inorganic semiconductor sub-cell. It is notable that in an embodiment in which the starting Si wafer was p-type, this operation would be to form a hole transport layer.

In the illustrative embodiment, electron transport layer 208 comprises a layer of titanium dioxide ($TiO_2$). In some embodiments, this layer of titanium dioxide is deposited, to a thickness of tens of nanometers, using atomic layer deposition (ALD). In the illustrative embodiment, the ALD-deposited layer has a thickness of about 30 nanometers, but the thickness of this layer can be a minimum of about 1 nanometer to a maximum of about 500 nanometers.

In some embodiments, an optional mesoporous layer of titanium dioxide is deposited on the ALD-deposited layer, such as by spin coating a solution of $TiO_2$ nanoparticles and subsequently sintering, such as at about 500° C. In the illustrative embodiment, the mesoporous layer has a thickness of about 300 nanometers. To the extent that the mesoporous layer is present, the thickness of this layer can be a minimum of about 1 nanometer to a maximum of about 2000 nanometers.

In some other embodiments, a material other than titanium dioxide, such as, without limitation, C60, Phenyl-C61-butyric acid methyl ester (PCBM), $SnO_2$, or ZnO, is used to form electron transport layer 208.

Referring now to FIGS. 5, 2, 4, and 6E, in operation 505, metal halide semiconductor stack 210 is formed. As depicted in FIG. 4, stack 210 comprises metal halide semiconductor material 418 and p-type heterojunction contact (hole transport layer) 420.

In the illustrative embodiment, metal halide semiconductor material 418 is methyl ammonium lead halide perovskite and p-type heterojunction contact 420 is 2,2',7,7'-Tetrakis-(N,N-di-4-methoxyphenylamino)-9,9'-spirobifluorene ("spiro-OMeTAD").

In some embodiments, the perovskite is deposited via a two-step conversion method modified from a procedure developed by Burschka et al. (J. Burschka et al., Nature v499, p316 (2013). Specifically, $PbI_2$ is dissolved in N,N-dimethylformamide (DMF) and is deposited by spin coating and dried for 30 minutes at 70° C. and then cooled to room temperature. Conversion occurs by submersion in an isopropyl alcohol (IPA) bath containing methylammonium iodide (MAI), resulting in a perovskite layer with a chemical formula $CH_3NH_3PbI_3$. In the illustrative embodiment, the perovskite layer fills the pores of the titanium dioxide of electron transport layer 208 and forms a capping layer thereon having a thickness of about 150 nanometers. More generally, the thickness of the metal halide semiconductor will be in the range of about 150 to about 2000 nanometers. Thus, metal halide semiconductor 418 is formed. As known to those skilled in the art, there are a variety of ways to form and deposit perovskite. In conjunction with the present disclosure, those skilled in the art will be able to suitably select other deposition methods, as desired.

The spiro-OMeTAD, as organic p-type heterojunction contact 420, was deposited on the perovskite by spin coating. Contact 420 will typically have a thickness in the range of about 1 to about 500 nanometers. In the illustrative embodiment, the resulting layer of spiro-OMeTAD was doped with spiro-$(TSFl)_2$ in a process developed by Nguyen and some of the present inventors (Nguyen et al., J. Am. Chem. Soc. v136, p10996 (2014)) and additionally included the organic additive tert-butylpyridine (tBP). In some other embodiments, other materials known to those skilled in the art can be used to form the hole-transport layer (i.e., p-type heterojunction contact 420) in known fashion.

Referring now to FIGS. 5, 2, 4, and 6E, in operation 506, top electrical contact or electrode 211 is formed, in the illustrative embodiment, as mesh of silver nanowires 644. The mesh is deposited in a multi-step process wherein the nanowires are sprayed from solution onto a plastic (PET) film. The silver nanowires are then transferred from the PET to the spiro-OMeTAD layer via mechanical transfer through, for example, the application of pressure (e.g., 2500 psi). The pressure is applied across a diaphragm through the application of compressed $N_2$ to ensure uniform pressure. Other techniques for applying pressure to accomplish the mechanical transfer, as will occur to those skilled in the art in light of the present disclosure, may suitably be used. In some embodiments, an electrically conductive material (e.g., a metal, etc.) is deposited as a contact pad around the perimeter of the mesh of silver nanowires to increase the efficiency of current collection as well as to provide a means of electrical contact to the mesh of silver nanowires. In the illustrative embodiment, the contact pad comprises silver and is deposited via thermal evaporation to a thickness of about 300 nanometers. In some alternative embodiments, other materials suitable for forming transparent electrodes (i.e., transparent to light over the desired range of wavelengths) are suitably used as top electrical contact 211. A partial and non-limiting list of such suitable materials include: ITO, FTO, AZO, other transparent electrically conductive oxides, and graphene.

Although the description has focused on a double-junction solar cell, the present teachings can be applied to create a solar cell having more than two junctions. For example, consider the following triple-junction architecture for a perovskite/silicon solar cell in accordance with the present teachings. The third junction is disposed on top of the "original" perovskite layer in the double-junction architecture and the original perovskite and silicon sub-cells remain substantially the same as disclosed. The third junction can be formed from another perovskite having a different composition than the original perovskite. The tunnel junction in the silicon itself would not change and the first heterojunction layer (electron or hole transport layer) is suitably generic.

Example: Formation of 2-Terminal Perovskite/c-Si Multi-Junction Solar Cell

Formation of Silicon Sub-Cell.

A double-side polished <100> n-type float zone silicon (Si) wafer (1-5 Ω-cm, 300 μm thickness) was procured. The front side of the wafer was coated with a silicon nitride ($SiN_x$) film having a thickness of about 300 nm. The purpose of the film is to protect the planarity of the silicon front surface during subsequent random pyramidal texturing step on the back side of the silicon starting wafer. Texturing was accomplished using 3% weight KOH solution in de-ionized (DI) water mixed with isopropanol (6:1 volume), 80° C. etch for 20 minutes.

The $SiN_x$ protective layer was removed using hydrofluoric acid (HF). The sample was then cleaned using the RCA cleaning procedure for silicon wafers (RCA1=10 minute, 80° C. dip in 5:1:1 $NH_4OH:H_2O_2:H_2O$, RCA2=10 minute, 80° C. dip in 5:1:1 $HCl:H_2O_2:H_2O$) as follows:

deionized (DI) water dip→HF dip→RCA1clean→DI water dip→HF dip→DI water dip→RCA2clean→DI water dip→HF dip→DI water dip→$N_2$ dying.

Boron was then implanted into the planar front surface ($^{11}B$ with $1.8\times10^{15}$ $cm^{-2}$ dose, 6 keV implantation energy) and phosphorus in the textured back surface ($^{31}P$ with $4\times10^{15}$ $cm^{-2}$ dose, 10 keV implantation energy) of the wafer. The wafer was then cleaned again using RCA cleaning procedure, dipped in dilute HF solution for oxide removal, cleaned with DI water, and dried with $N_2$. The p-type B emitter and n-type P back surface field (BSF) were formed simultaneously by drive-in annealing at 960° C. in an $N_2$ ambient for 30 minutes.

After the emitter and BSF formation, the wafers were cleaned again with RCA cleaning procedure, and then dipped in dilute HF solution for oxide removal, cleaned with DI water, and dried with $N_2$.

The $n^{++}/p^{++}$ tunnel junction was then formed by depositing heavily doped $n^{++}$ hydrogenated amorphous silicon (a-Si:H) using plasma-enhanced chemical vapor deposition (PECVD). First, an intrinsic a-Si layer having a thickness of about 2-3 nm-thick was deposited on top of the $p^{++}$ emitter using PECVD (temperature of 250° C., pressure of 150 mTorr, 55 sccm of $SiH_4$ gas with a plasma power density of 0.16 W/$cm^2$). Next, an a-Si:H layer having a thickness of about 30 nm was deposited at 250° C. at a pressure of 200 mTorr (55 sccm of $SiH_4$ gas and 50 sccm of 1% $PH_3$ in $H_2$ gas) and plasma power density of 0.13 W/$cm^2$. The nearly finished Si sub-cell was then annealed in $N_2$ ambient at 680° C. for 15 minutes to activate the dopants and partially crystallize the amorphous layer.

After forming the tunnel junction, square-shaped mesas were formed using photolithography. The mesas were 1.1× 1.1 $cm^2$ and spaced apart 1.4×1.4 $cm^2$. The mesas were formed as follows. Positive photoresist was deposited on both sides of the silicon wafer (Shipley 1813 photoresist spun at 4000 rpm for 40 seconds, baked at 115° C. for 1 minute). The front side underwent mesa patterning, was exposed for 4.5 seconds, and developed in CD-26 developer for approximately 1 minute. The back side was left unexposed to protect the BSF on the back side during the subsequent mesa formation step. Mesas were then formed on the front side of the Si wafer using reactive ion etching (RIE) to etch 300 nm of the silicon layer, removing the $n^{++}$ tunnel junction and most of the $p^{++}$ emitter outside the square-shaped mesa. The remaining photoresist mask was then removed using solvent clean (3 minute sonication in acetone, 3 minute sonication in IPA, rinsing with DI water and drying with $N_2$).

Next, the nascent Si sub-cell was dipped in dilute HF for oxide removal, cleaned with DI water, and dried in $N_2$. The back metallization was then formed via electron-beam evaporation. A stack of Ti/Pd/Ag/Pt with layer thicknesses of about 20/20/300/30 nm was chosen (Ti for adhesion, Pd for metal diffusion barrier, Ag for electrical conduction, and Pt for corrosion protection during perovskite sub-cell processing) followed by rapid thermal anneal (400° C. in $N_2$ for 5 minutes) to improve metal adhesion.

This was followed by dipping in dilute HF for oxide removal, cleaning in DI water, and drying in $N_2$. Next a layer of $TiO_2$ was deposited via atomic layer deposition to a thickness of 30 nm (Cambridge NanoTech Savannah ALD tool, 150° C. substrate temperature, 80° C. precursor temperature, 440 mTorr base pressure, and 20 sccm $N_2$ carrier gas). To achieve the desired $TiO_2$ layer thickness, 604 cycles of pulsing $H_2O$ vapor for 0.02 seconds were performed followed by a seven-second wait period, followed by pulsing TDMAT vapor for 0.2 seconds, and then a seven-second wait.

After depositing the $TiO_2$ via ALD deposition, photoresist was deposited on the $TiO_2$ to protect it during the following step (Shipley 1818 photoresist spun at 4000 rpm for 40 seconds, baked at 115° C. for 1 minute). Dilute HF with 10% concentration in DI was then used to dissolve the $TiO_2$ layer that was deposited on the back metallization during the ALD process.

The Si sub-cells with overlying electron transport layer ($TiO_2$) were then laser-scribed from the back to form 1.4×1.4 $cm^2$ units. After mechanical cleaving, individual 1.4×1.4 $cm^2$ sub-cells, each with a 1.1×1.1 $cm^2$ square-shaped mesa (active junction area) in the middle and a $TiO_2$ layer on the planar front surface protected by photoresist resulted.

Formation of Perovskite sub-cell. The sub-cells were prepared for further processing by sonication in acetone for 5 minutes, sonication in IPA for 5 minutes, rinsing with DI water, and drying with $N_2$, 5 minutes of UV-ozone cleaning, and sintering for 30 minutes at 450° C. After cool down, mesoporous $TiO_2$ films were spun onto the ALD deposited layer of $TiO_2$ at 4000 rpm for 30 seconds and sintered at 450° C. The spin-coating solution was a 1:3 dilution of 18-NRT $TiO_2$ paste (Dyesol) in ethanol.

All previous steps were performed in ambient atmosphere. The remainder of device fabrication was performed in a $N_2$ glovebox with <5 ppm $O_2$ and $H_2O$. The sub-cells were dried by heating to 500° C. with a hot-air gun for 30 minutes and immediately brought into the glovebox. A 1.3 molar solution of $PbI_2$ was prepared by dissolving $PbI_2$ (Aldrich, 211168) into anhydrous DMF (Acros, 32687) and stirring on a hotplate at 100° C. The DMF was filtered through a 200 nm PTFE filter (Pall, 4552) prior to adding to the solution in order to remove particulates. Methylammonium iodide (MAI) was purchased from Dyesol and used as received. A solution of 10 milligram (mg) MAI per 1 milliliter (mL) anhydrous IPA (Acros, 61043) was prepared and allowed to dissolve at room temperature. A pure IPA rinse solution was prepared as well. The IPA was filtered through a 20 nm PTFE filter prior to adding to the solutions in order to remove particulates.

After the sub-cells were cooled to room temperature, 100 microliters (μL) of the 100° C. $PbI_2$/DMF solution was pipetted onto the substrate and spun at 6500 rpm for 90 seconds. The resulting film was dried for 30 minutes on a 70° C. hotplate. After cooling, the films were dipped in the MAI/IPA solution for 15 minutes. Films were then rinsed in IPA, dried by spinning at 4000 rpm for 30 seconds, and placed back on the 70° C. hotplate for 30 minutes.

After cooling, 75 μL of a spiro-OMeTAD (Lumtec, LT-S922) solution was spun on top perovskite layer at 4000 rpm for 30 seconds. The spiro-OMeTAD was a 163 millimolar (mM) solution of spiro-OMeTAD in anhydrous chlorobenzene (Sigma-Aldrich, 284513). The spiro-OMeTAD was dissolved by placing on a hotplate at 70° C. for more than 30 minutes. 534 mM of tert-butyl pyridine (Aldrich, 142379) and 86 mM of Li-TFSI (Aldrich, 15224) dissolved as 520 mg/mL in anhydrous acetonitrile (Acros, 61096) were added to the spiro-OMeTAD solution. 8 mol % of the spiro-OMeTAD was spiro-OMeTAD(TFSI)$_2$, resulting in 16% of spiro-OMeTAD molecules being chemically oxidized to ensure electrical conductivity in the spiro-OMeTAD layer. The spiro-OMeTAD(TFSI)$_2$ was synthesized as reported elsewhere in literature. After the spiro-OMeTAD solution was prepared, it was filtered through a 20 nm $Al_2O_3$ filter (Whatman, 6809-3102) to remove any aggregates and particulates. Films were then removed from the glovebox and stored overnight in a desiccator at 20% relative humidity (RH).

A mesh of silver nanowires on PET was transferred on top of the spiro-OMeTAD layer. A spring-loaded ball bearing, rather than gas pressure, was used to better control the pressure applied to the silver nanowire mesh. The spring was set to 500 grams force at full depression of the ball into the housing. After transfer of the silver nanowire mesh, a pad of silver was thermally evaporated to a thickness of about 300 nm through a patterned shadow mask around the edges of the device leaving 1×1 $cm^2$ active area in the middle of the 1.1×1.1 $cm^2$ mesa. The silver helped reduce the unnecessary series resistance in the silver nanowires by not limiting the current collection to one geometrical direction. The nearly completed device was light-soaked under visible illumination for 10 minutes then stored in a desiccator for 12 hours before applying an anti-reflective coating. The anti-reflective coating was an LiF film having a thickness of about 111 nm. This thickness was optimized to provide anti-reflection for the visible spectrum.

It is to be understood that the disclosure teaches just one example of the illustrative embodiment and that many variations of the invention can easily be devised by those skilled in the art after reading this disclosure and that the scope of the present invention is to be determined by the following claims.

With respect to variations, those skilled in the art will recognize that BSF (i.e., BSF 314) is one of several possible back contacts. For example, in some architectures, rather than BSF, a heterojunction layer is used for back contact, either amorphous silicon or poly silicon. Also, in some architectures, a thin passivation layer is disposed between base-emitter and base-back contact. For example, in a heterojunction-intrinsic-thin (HIT) cell, wherein 2 to 3 nanometers of intrinsic amorphous silicon is included between base-emitter and base-back contact, wherein both the emitter and back contact are amorphous silicon, which forms a heterojunction with the crystalline silicon base. Other embodiments include a tunnel-oxide-passivated contact (TOPCon), wherein about 1.5 nanometers of $SiO_x$ is included between base-emitter and base-back contact, wherein both the emitter and back contact are polycrystalline silicon.

What is claimed is:

1. An article comprising a two-terminal multi-junction solar cell comprising:
   a crystalline n-type or p-type silicon sub-cell, a top layer of which is a p++ single-crystalline silicon emitter or an n++ single-crystalline silicon emitter, respectively;
   a bottom electrode disposed below a bottom surface of the crystal silicon sub-cell;
   a tunnel junction disposed above the silicon sub-cell, wherein the tunnel junction consists essentially of one of either degenerately doped n-type polysilicon or degenerately doped p-type polysilicon, respectively;

a metal halide semiconductor sub-cell disposed above the tunnel junction; and a top electrode disposed above a top surface of the metal halide semiconductor sub-cell.

2. The article of claim 1 wherein the metal halide semiconductor is defined by the formula $AM(I_xH_{1-x})_3$, where A is a cation, M is a metal, H is a halide, and x, which is iodine fraction, falls in a range of 0 to 1, inclusive.

3. The article of claim 1 wherein the metal halide semiconductor is a metal halide perovskite.

4. The article of claim 1 wherein the crystalline silicon sub-cell comprises, below the silicon emitter, a silicon base, and a back surface field disposed proximal to a bottom surface of the silicon base.

5. The article of claim 1 wherein the metal halide semiconductor sub-cell comprises:
a transport layer, wherein the transport layer is an electron transport layer when a silicon base in the crystalline silicon sub-cell is n-type silicon and wherein the transport layer is a hole transport layer when the silicon base in the crystalline silicon sub-cell is p-type silicon;
a layer of metal halide semiconductor; and
a heterojunction contact, wherein the heterojunction contact is p-type when the silicon base is n-type silicon and the heterojunction contact is n-type when the silicon base is p-type silicon.

6. The article of claim 5 wherein the transport layer comprises $TiO_2$.

7. The article of claim 5 wherein the metal halide semiconductor is a metal halide perovskite.

8. The article of claim 5 wherein the heterojunction contact comprises spiro-OMeTAD.

9. The article of claim 1 wherein the top electrode comprises a mesh of silver nanowires.

10. An article comprising a two-terminal multi-junction solar cell comprising:
a bottom sub-cell comprising a single-crystalline silicon base and a single-crystalline silicon emitter;
a tunnel junction disposed above the bottom sub-cell, wherein the tunnel junction consists essentially of one of either degenerately doped n-type polysilicon or degenerately doped p-type polysilicon; and
a top sub-cell disposed above the tunnel junction, wherein the top sub-cell comprises a metal halide perovskite.

11. The article of claim 10 further comprising a mesh of silver nanowires disposed above the top sub-cell and serving as a top electrical contact of the solar cell.

12. The article of claim 10 wherein:
the bottom sub-cell further comprises a n++ back surface field; and
the top sub-cell further comprises an electron transport layer and an organic p-type heterojunction contact.

13. A method for forming a two-terminal multi-junction solar cell comprising:
forming a single-crystalline silicon sub-cell comprising a single-crystalline silicon emitter;
forming a tunnel junction above the single crystalline silicon sub-cell, wherein the tunnel junction consists essentially of one of either degenerately doped n-type polysilicon or degenerately doped p-type polysilicon; and
forming a metal halide semiconductor sub-cell above the tunnel junction.

14. The method of claim 13 and further comprising forming a top electrical contact by depositing a mesh of silver nanowires above the metal halide semiconductor sub-cell.

15. The method of claim 13 wherein forming the metal halide semiconductor sub-cell further comprises:
forming a transport layer above the tunnel junction, wherein the transport layer is an electron transport layer when a silicon base in the single-crystalline silicon sub-cell is n-type silicon and wherein the transport layer is a hole transport layer when the silicon base in the single-crystalline silicon sub-cell is p-type silicon;
depositing metal halide semiconductor above the transport layer; and
depositing a heterojunction contact above the metal halide semiconductor, wherein the heterojunction contact is p-type when the silicon base is n-type silicon and the heterojunction contact is n-type when the silicon base is p-type silicon.

16. The method of claim 13 wherein the metal halide semiconductor is defined by the formula $APb(I_xH_{1-x})_3$, where A is a cation, H is a halide, and x, which is iodine fraction, falls in a range of 0 to 1, inclusive.

17. The method of claim 13 wherein forming the tunnel junction further comprises: at least partially recrystallizing one of degenerately doped n-type amorphous silicon or degeneratively doped p-type amorphous silicon.

18. The method of claim 13 wherein the metal halide semiconductor is methylammonium lead iodide perovskite.

* * * * *